United States Patent
Spyrou

(10) Patent No.: US 10,223,493 B1
(45) Date of Patent: Mar. 5, 2019

(54) DYNAMIC TAG ALLOCATION FOR CLOCK RECONVERGENCE PESSIMISM REMOVAL

(71) Applicant: Altera Corporation, San Jose, CA (US)

(72) Inventor: Athanasius Spyrou, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 161 days.

(21) Appl. No.: 15/195,517

(22) Filed: Jun. 28, 2016

(51) Int. Cl.
*G06F 17/50* (2006.01)

(52) U.S. Cl.
CPC ...... *G06F 17/5081* (2013.01); *G06F 2217/62* (2013.01)

(58) Field of Classification Search
CPC .................. G06F 17/5081; G06F 2217/62
See application file for complete search history.

(56) References Cited

U.S. PATENT DOCUMENTS

| | | | |
|---|---|---|---|
| 5,426,591 A * | 6/1995 | Ginetti | G06F 17/5031 703/19 |
| 6,401,231 B1 | 6/2002 | Belkhale et al. | |
| 6,543,037 B1 | 4/2003 | Limqueco et al. | |
| 6,672,776 B1 | 1/2004 | Limqueco et al. | |
| 7,406,669 B2 | 7/2008 | Lindberg | |
| 7,480,881 B2 | 1/2009 | Tetelbaum et al. | |
| 8,171,440 B2 | 5/2012 | Kanno | |
| 8,434,040 B2 | 4/2013 | Bhardwaj et al. | |
| 8,615,727 B2 | 12/2013 | Ghanta et al. | |
| 8,745,561 B1 | 6/2014 | Garg et al. | |
| 8,775,855 B2 | 7/2014 | Bhardwaj et al. | |
| 8,813,011 B2 | 8/2014 | Bhardwaj et al. | |
| 2003/0121013 A1 | 6/2003 | Moon et al. | |
| 2016/0110485 A1* | 4/2016 | Sequeira | G06F 17/5031 716/108 |

OTHER PUBLICATIONS

Rutenbar, Rob A., Timing Analysis at the Logic Level, Lecture 17, Carnegie Mellon University, Pittsburgh, PA, 2001.

* cited by examiner

*Primary Examiner* — Vuthe Siek
(74) *Attorney, Agent, or Firm* — Treyz Law Group, P.C.; Vineet Dixit

(57) ABSTRACT

Electronic design automation tools may perform static timing analysis on an integrated circuit design. An integrated circuit design may have multiple nodes that can be traversed using a breadth-first search. To reduce the run-time of static timing analysis tools, tags recording arrival times associated with non-critical paths may have their consolidated in order to include only the critical timing information in the tag, thereby reducing the amount of data that is carried through to the analysis of the entire design. In a critical slack based merging method, a maximal arrival time associated with a circuit node may be compared to the remaining arrival times associated with the circuit node. Arrival times less than the maximal arrival time by an amount greater than a threshold amount may be deemed non-critical arrival times and may be removed from the tag for the circuit node.

17 Claims, 9 Drawing Sheets

US 10,223,493 B1

DYNAMIC TAG ALLOCATION FOR CLOCK RECONVERGENCE PESSIMISM REMOVAL

BACKGROUND

This invention relates to a method for removing unnecessary pessimism from static timing analyses. Specifically, for designs having combinational logic circuits fed by multiple registers, the present invention reduces the number and size of tags, which are node identifiers with a list of arrival times and partial path completion information, needed during static timing analysis.

In digital circuits, when a clock latches a first data value at a launch register or launch flip-flop, the clock must also arrive at a capture register or flip-flop which will store a second data value that is produced based on the first data value by combinational logic circuitry interposed between the launch register and the capture register. To ensure proper functionality of the capture register, the second data value produced by the combinational logic circuitry must arrive at the capture register before the next cycle of the clock arrives at the capture register. The interval during which the second data value is present at the capture register before the arrival of the next clock cycle is referred to as the setup time.

The second data value must also be maintained at the capture register for an interval after the arrival of the next clock cycle to ensure that the second data value is sampled properly. This interval specifying the amount of time required for the second data value to be sampled properly is referred to as the hold time.

In timing analysis, some circuits may be too slow and the setup time may fall below a required threshold duration. For example, the second data value may arrive at the capture register after the next clock cycle arrives resulting in a failure to capture the second data value at the next clock cycle. Some circuits may be too fast and the hold time may fall between a required threshold duration. For example, the second data value may arrive at the capture register before the next clock cycle arrives, but results in an inaccurate or incomplete capture of the second data value if the second data value is not held for long enough after the arrival of said next clock cycle.

Clock reconvergence pessimism may refer to timing slack that is introduced or maintained in the circuit to ensure that adequate setup and hold times are maintained. In conventional timing analysis tools, a breadth-first approach is used when maintaining tags for data arrival and data departure times at different nodes in a circuit design. Consequently, for a given node, all of the worst-case arrival times for inputs from the fan-in to a given node are maintained in the tag or node identifier. Breadth-first approaches improve run-time by not tracing each path from potential launch registers to potential capture registers, at the expense of increased tag sizes for the nodes, as all of the worst-case arrival times from the fan-in to a node are maintained. As the number of nodes increases, the size of the tags used by conventional timing analysis tools may increase exponentially.

Conventional approaches to static timing analysis may result in designs overly pessimistic setup and hold timing slack. Overly pessimistic timing slack may cause false failures that are then corrected by unnecessarily adding routing, which consumes short wire interconnect resources and affects the maximum operating frequency (Fmax) of the design.

It would therefore be desirable to improve the tag allocation used by static timing analysis tools.

SUMMARY

Electronic design tools may perform timing analysis on an integrated circuit design. The integrated circuit design may include a plurality of registers with associated clock input nodes and data input nodes. The electronic design tools may analyze the circuit nodes of the integrated circuit design and evaluate clock or data arrival times at a starting set of circuit nodes in the integrated circuit design. As an example, the starting set of circuit nodes may be clock input nodes of a first set of registers in the integrated circuit design.

The output of the first set of registers in the integrated circuit design may be provided to combinational logic circuitry that acts on the output of the first set of registers to produce a logic output result, which is provided to at least one additional register. The logic depth of the first set of registers may be a first value, such as zero, while the logic depth of the next register(s) that receives data based on the output of the first set of registers may be a second value incremented from the first value, such as one.

Each of the nodes in the integrated circuit design may be assigned a tag by the electronic design tools. The tags may specify the logic depth, the data/clock arrival time, and partial path completion information. Partial path completion information may describe which clock point was used to provide data to the circuit node, or the portion of a common delay path from a clock source that is applied to the circuit node receiving the clock signal at the starting set of circuit nodes.

Partial path completion information may be carried over across tags as the arrival times are updated. For a given circuit node receiving data from two different nodes, the arrival times and respective partial path completion information for the arrival times may be maintained in the tag for the given circuit node. A tag consolidation method may perform a breadth-first search of the nodes in an integrated circuit design starting from a starting set of circuit nodes.

At nodes having a logic depth greater than or equal to a threshold logic depth, tag information may be consolidated according to a critical slack based merging scheme. In the critical slack based merging scheme, it is determined whether a maximal arrival time in a tag exceeds any of the other arrival times in the tag by an amount exceeding the full clock delay spread. Arrival times that are exceeded by the maximal arrival time by an amount exceeding the full clock delay spread may be deemed non-critical arrival times, and may be removed from the tag. The full clock delay spread may correspond to a maximum possible delay spread contributed by delay elements in a clock path provided to a node in the starting set of circuit nodes being traversed in the breadth-first search.

The threshold logic depth may be set to zero, such that all tags in the timing analysis are evaluated for opportunities for tag information consolidation.

DETAILED DESCRIPTION

Embodiments of the present invention relate to methods for performing static timing analysis (STA) for logic designs. Logic designs may be implemented on programmable logic circuits such as field programmable gate array (FPGA) circuits or any other suitable logic design.

Figure 1:
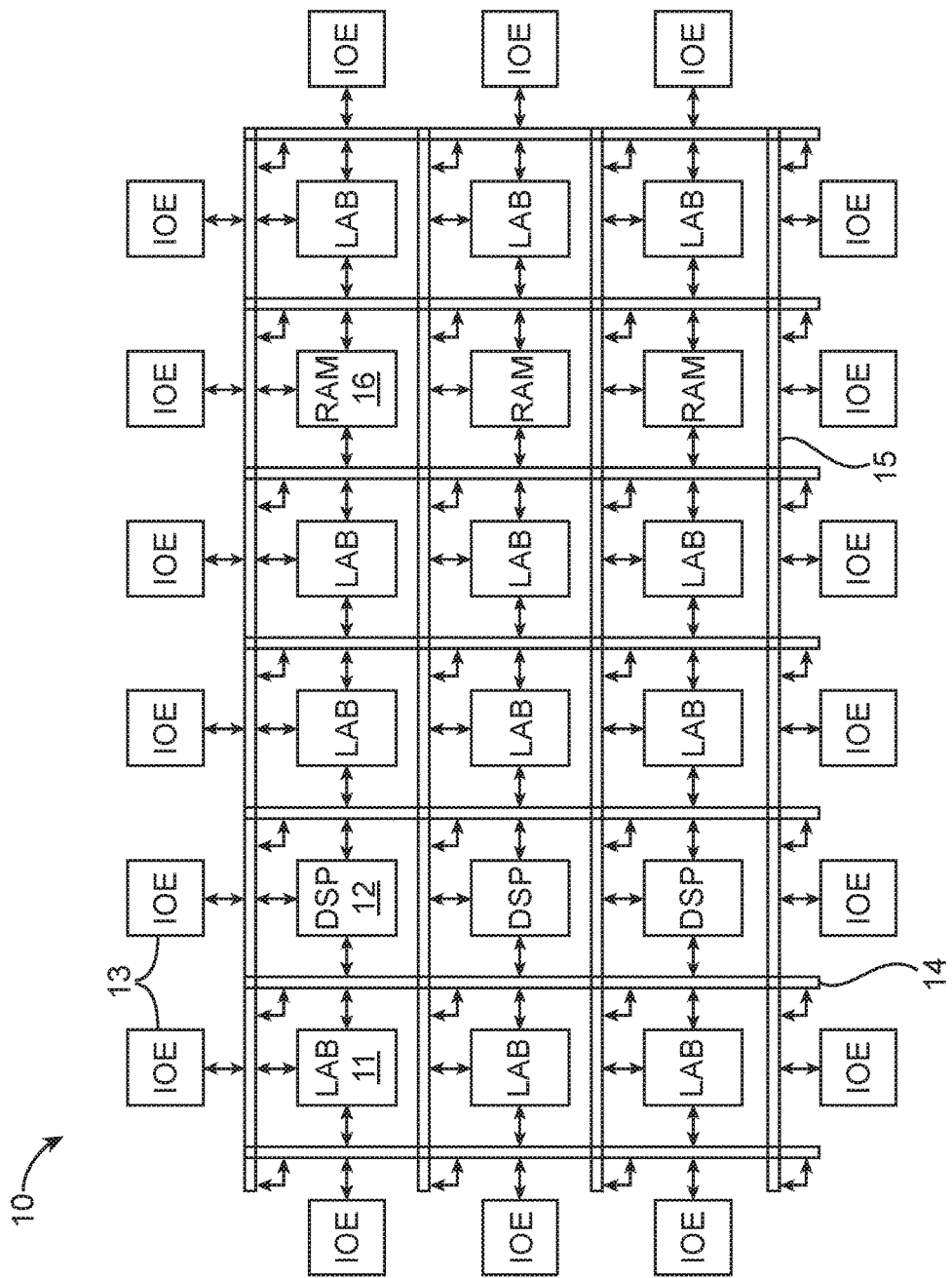
FIG. 1 illustrates a simplified block diagram of a programmable integrated circuit in accordance with an embodiment.

An illustrative embodiment of an integrated circuit such as a programmable logic device (PLD) 10 that may be designed using computer-aided design (CAD) tools and analyzed using static timing analysis (STA) tools is shown in FIG. 1. Programmable logic device 10 may have input-output (I/O) circuitry 13 for driving signals off PLD 10 to external circuitry and for receiving signals from other devices external to the PLD 10. Input-output (I/O) circuitry 13 may include conventional input-output (I/O) circuitry, serial data transceiver circuitry, differential receiver and transmitter circuitry, or other circuitry used to connect one integrated circuit to another integrated circuit.

Programmable logic regions may include programmable components such as digital signal processing circuitry 12, storage circuitry 16, or other combinational and sequential logic circuitry organized in logic array blocks (LABs) 11. The programmable logic regions may be configured to perform a custom logic function. If desired, the programmable logic region may include digital signal processing circuitry 12 and storage circuitry 16 which both may be organized in specialized blocks that have limited configurability. The programmable logic region may include additional specialized blocks such as programmable phase-locked loop circuitry, programmable delay-locked loop circuitry, or other specialized blocks with limited configurability.

The circuitry of programmable logic device 10 may be organized using any suitable architecture. As an example, the logic of programmable logic device 10 may be organized in a series of rows and columns of larger programmable logic regions each of which contains multiple smaller logic regions. The smaller regions may be, for example, regions of logic that are sometimes referred to as logic elements (LEs) or basic logic elements (BLEs), each containing a look-up table, one or more registers, and programmable multiplexer circuitry. The smaller regions may also be, for example, regions of logic that are sometimes referred to as adaptive logic modules (ALMs), configurable logic blocks (CLBs), slice, half-slice, etc. Each adaptive logic module may include a pair of adders, a pair of associated registers and a look-up table or other block of shared combinational logic (i.e., resources from a pair of LEs—sometimes referred to as adaptive logic elements or ALEs in this context). The larger regions may be, for example, logic array blocks (LABs) or logic clusters of regions of logic containing multiple logic elements or multiple ALMs. The LABs 11 may also be referred to as "logic sectors," or "sectors of logic fabric." Generally, regions in PLD 10 that contain multiple LABs may be referred to as the "logic fabric" of the PLD 10.

The logic fabric of the PLD 10 may be used to implement combinational logic circuitry that performs user defined logic functions. Registers may be coupled to, or interposed between different combinational logic circuits in the logic fabric and may be used to capture intermediate results of the user defined logic functions at clock cycles. Registers coupled to combinational logic circuits may capture valid data at each clock cycle of an associated clock, or at selected clock cycles of an associated clock.

Vertical interconnection resources 14 and horizontal interconnection resources 15 such as global and local vertical and horizontal conductive lines and buses may be used to route signals on PLD 10. Vertical and horizontal interconnection resources 14 and 15 include conductive lines and programmable connections between respective conductive lines and are therefore sometimes referred to as programmable interconnects. Vertical and horizontal interconnection resources 14 and 15 may be used to connect registers in different regions of the logic fabric, and may exhibit delay when propagating signals.

Figure 2:
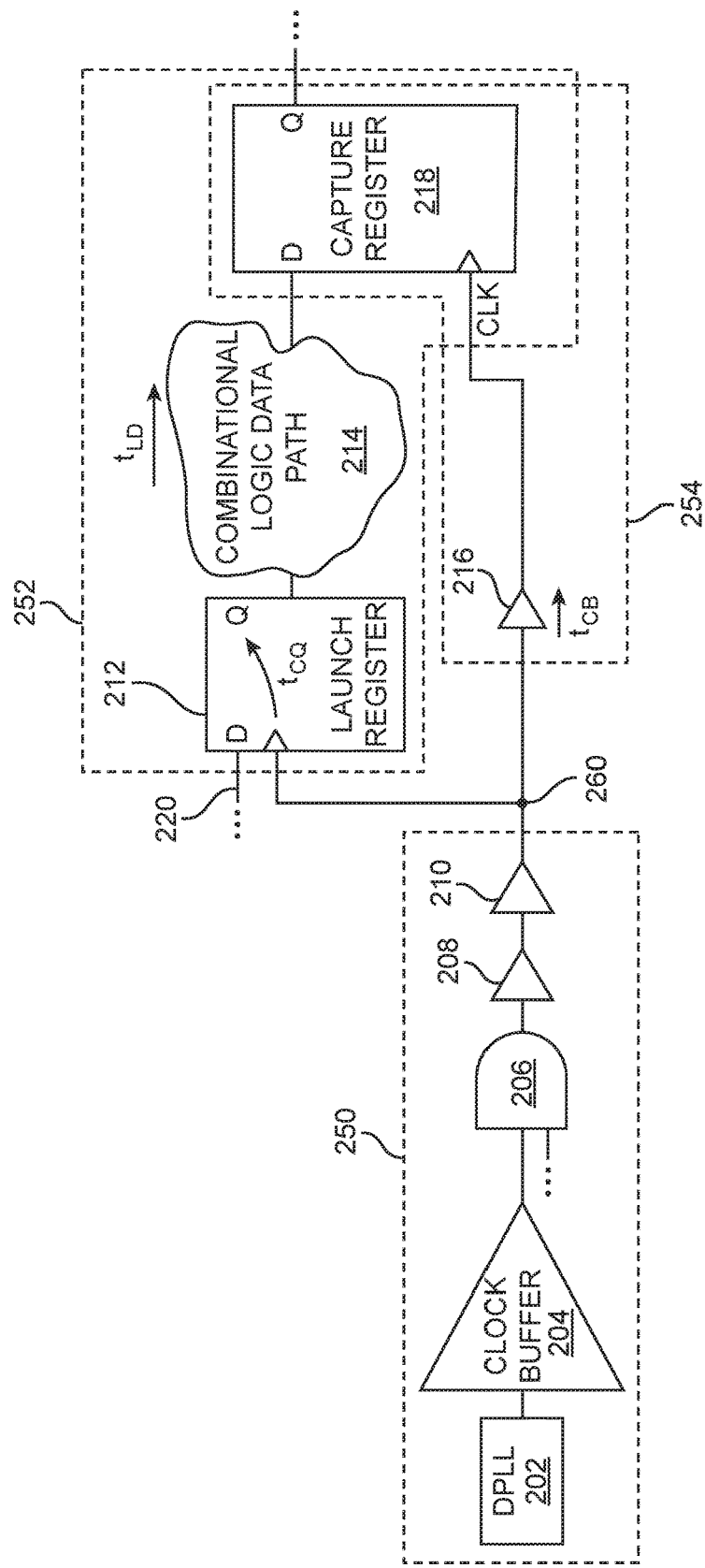
FIG. 2 illustrates a circuit with a common set of components and divergent sets of components that a clock signal traverses in accordance with an embodiment.

FIG. 2 illustrates an exemplary path for clock signals provided to different registers in the logic fabric of the PLD 10. A digital phase-locked loop (DPLL) circuit 202 may produce a clock signal. The clock signal produced by the DPLL 202 may propagate through one or more clock buffers such as 204, 208, and 210, and gating circuitry such as 206. The gating circuitry 206 may receive the clock signal from clock buffer 204, and may receive additional gating signals (not illustrated in FIG. 2) to control when the clock signal is allowed to propagate through the gating circuitry 206 to the clock buffers 208 and 210. Clock buffers 204, 208, and 210 may generally introduce respective amounts of delay to the clock signal produced by the DPLL 200.

The clock signal produced by the DPLL 200 may propagate along a single path until it reaches node 260, also known as the common node 260. From the DPLL up to the common node 260, the clock signal produced by DPLL has been subject to delay by a common set of components. In the example of FIG. 2, these common components include the clock buffers 204, 208, and 210, and the gating circuit 206. Timing analysis of the path of the clock signal traveling through the components 250 may be referred to as the common path timing analysis.

When a timing analysis is performed (of the common path or any other path), a given path or connection that couples one logic element to another in the circuit design may be evaluated. Timing analysis may produce two values for each analyzed path, namely, setup margin and hold margin. The setup margin of a particular signal path refers to the margin (or time period) available on the path for which a signal travelling through the path has to be stable before the arrival of its corresponding clock signal. The hold margin refers to the margin available on the signal path for which the same signal has to be stable after the arrival of its corresponding clock signal.

Figure 3:
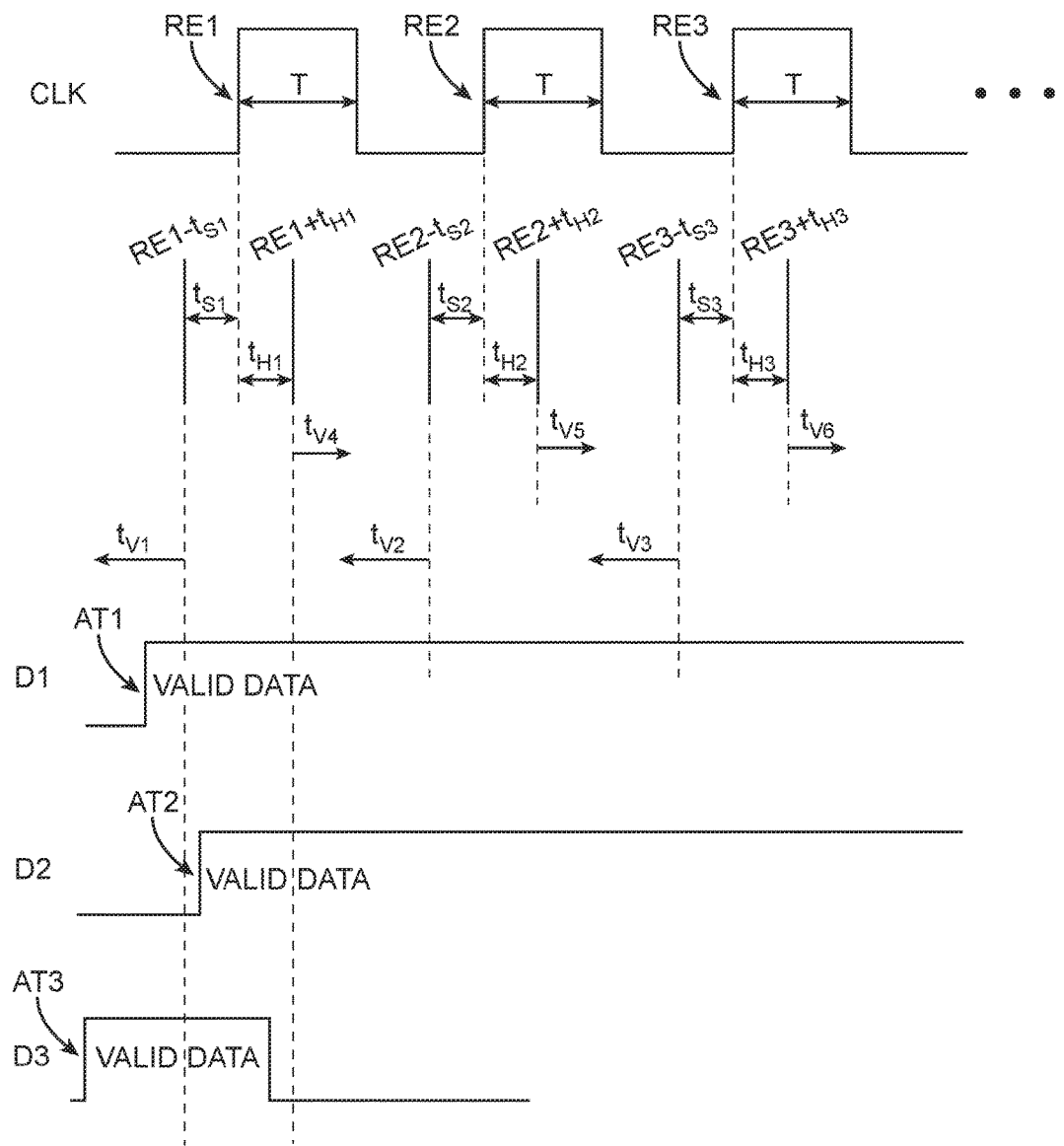
FIG. 3 illustrates a clock signal and data lines that are valid at different times relative to the setup and hold margins associated with the clock signal in accordance with an embodiment.

Turning to FIG. 3, a clock signal CLK and its setup and hold margins are illustrated. The clock signal CLK may have multiple rising edges RE1, RE2, and RE3. While in some embodiments registers 212 and 218 may be triggered by rising clock edges or falling clock edges, the below explanation assumes, for the sake of clarity, that the registers such as the launch register 212 and the capture register 218 are triggered by rising clock edges.

The aforementioned setup margin may refer to the intervals $t_{S1}$, $t_{S2}$, and $t_{S3}$ for their respective rising edges RE1, RE2, and RE3 of FIG. 3. Data received before the RE1−$t_{S1}$ (i.e., in the time interval $t_{V1}$) may have an adequate arrival setup timing slack for sampling at the RE1 clock edge. Similarly, data received before the RE2−$t_{S2}$ (i.e., in the time interval $t_{V2}$) may have an adequate arrival setup timing slack for sampling at the RE2 clock edge, and data received before the RE3−$t_{S3}$ (i.e., in the time interval $t_{V3}$) may have an adequate arrival setup timing slack for sampling at the RE3 clock edge.

Assuming that data values to be sampled at the rising edges RE1, RE2, and RE3 arrive in the respective intervals $t_{V1}$, $t_{V2}$, and $t_{V3}$, the data values may need to be held for a duration referred to above as the hold margin. The respective hold margins for the rising edges RE1, RE2, and RE3 may be illustrated as the intervals $t_{H1}$, $t_{H2}$, and $t_{H3}$. Data maintained up until or past the RE1+$t_{H1}$ (i.e., in the time interval $t_{V4}$) may have an adequate arrival hold timing slack for sampling at the RE1 clock edge. Similarly, data maintained up until or past the RE2+$t_{H2}$ (i.e., in the time interval $t_{V5}$) may have an adequate arrival hold timing slack for sampling at the RE2 clock edge, and data maintained up until or past the RE4+$t_{H3}$ (i.e., in the time interval $t_{V6}$) may have an adequate arrival hold timing slack for sampling at the RE3 clock edge.

Illustrative data lines D1, D2, and D3 are shown in FIG. 3. The arrival times AT1, AT2, and AT3 of the respective data lines D1, D2, and D3 may correspond to data arrival times at registers in a data path. Using the circuitry of FIG. 2 as an example, the data lines D1, D2, and D3 may illustrate the data line input to the D port of the capture register 218, while the CLK line of FIG. 3 may illustrate the clock input CLK to the capture register 218 of FIG. 2. In connection with the circuitry of FIG. 4, discussed in greater detail below, the data lines D1, D2, and D3, may represent any of the data lines provided to the D ports of the registers 482, 492, 494, or 496, while the CLK line of FIG. 3 may illustrate the clock inputs to said registers. Valid data is provided on the data line D1 during the intervals $t_{V1}$ and $t_{V4}$, as the arrival time AT1 of the data on line D1 is within the $t_{V1}$ interval (i.e., prior to RE1−$t_{S1}$) and held within the $t_{V4}$ interval as well (i.e., after RE1+$t_{H1}$). In other words, the data on line D1 may have adequate setup and hold timing slack and its arrival time A1 may require no adjustment.

Valid data on line D2, however, is provided outside of the interval $t_{V4}$, at some instant in time that is between RE1−$t_{S1}$ and RE1. In other words, the arrival time AT2 is too late for the setup margin of the rising edge RE1. The data on line D2 therefore has inadequate setup timing slack, and may result in a failed sample at the rising clock edge RE1. To correct for this failure condition, the clock period T may be increased (thereby reducing the operating frequency Fmax of the circuitry using the data line D2), the clock CLK may be delayed (so that the data D2 is valid within the setup and hold margins of another rising clock edge), the data on line D2 may be sampled at the next rising edge RE2 (potentially delaying the operation of circuitry that depends on the value latched by a register receiving the data line D2).

Valid data on line D3 is provided inside the interval $t_{V1}$ (as shown by having an arrival time AT3 that is prior to RE1−$t_{S1}$), yet outside of the interval $t_{V4}$ (as shown by the validity of the data ending before RE1+$t_{H1}$). The data on line D3 therefore has inadequate hold timing slack, and may result in a failed sample at the rising clock edge RE1. To correct for this failure condition, the clock period T may be increased (thereby reducing the operating frequency Fmax of the circuitry using the data line D3), or the clock CLK may be delayed (so that the data D3 is valid within the setup and hold margins of another rising clock edge such as a clock edge prior to RE1).

Returning to FIG. 2, it can be appreciated that at the common node 260, the clock produced by DPLL may propagate along two different paths, namely a first path through the components 252 and a second path through the components 254. Components 252 may include a launch register 212, a combinational logic data path 214, and may culminate at the capture register 218. Components 254 may include a clock buffer 216 and may culminate at the capture register 218. The first and second paths may have different associated delays for the clock signal received from common node 260 (and produced by DPLL 202).

In response to receiving the clock signal produced by DPLL from the common node 260, the launch register 212 may latch a value from input 220 and output it to the combinational logic data path 214. The duration from a rising clock edge arriving at the launch register 212 to valid data corresponding to the sample of input 220 being provided at the output Q of the launch register 212 may be referred to as clock-to-output delay $t_{CQ}$. After receiving the data from the output Q of the launch register 212, combinational logic data path 214 may then produce an output and provide it to the data input of the capture register 218. The duration from the valid output from the launch register 212 arriving at the combinational logic data path 214 to the production of the output from the logic data path 214 may be referred to as the combinational logic delay $t_{LD}$. The time duration from the arrival of the clock at the clock input of launch register 212 to the arrival of the data at the D input of the capture register 218 may be the sum of $t_{CQ}$ and $t_{LD}$.

When received at the components 254, the clock signal may optionally pass through one or more clock buffers 216 before being received at the clock input of the capture register 218. The delay exhibited by the clock buffer 216 may be referred to as $t_{CB}$. The time duration from the arrival of the clock at the one or more clock buffers 216 to the clock input of the capture register 218 may be $t_{CB}$.

From common node 260, then, it can be inferred that the arrival time of data at the capture register is equal to the sum of $t_{CQ}$ and $t_{LD}$, whereas the arrival time of the clock at the clock input of the capture register 218 is equal to $t_{CB}$. As mentioned above, timing analysis may produce two values for each analyzed path, namely, setup margin and hold margin. It may be advantageous to take into account the components 250 being shared between both paths (i.e., the path to the data input D of capture register 218 and the path to the clock input of the capture register 218) and subtract or omit the timing spread attributed to the components 250 at least because the components 250 are common to both paths (i.e., the divergence in the clock path begins at the output of the components 250—the common node 260).

Figure 4:
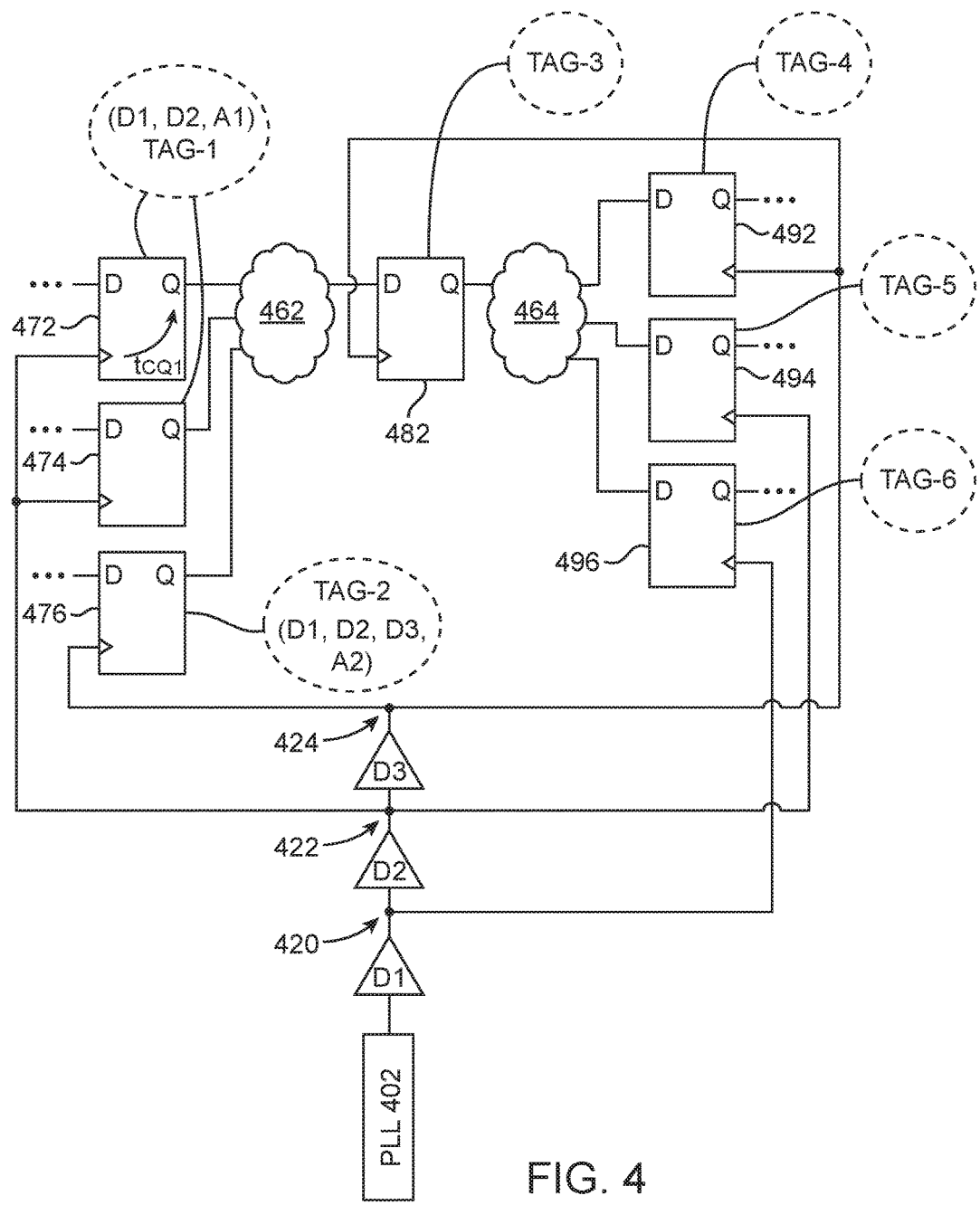
FIG. 4 illustrates register circuitry that is coupled to combinational logic circuitry in an integrated circuit design and tags recording arrival times in accordance with an embodiment.

FIG. 4 illustrates an example of registers that receive clock signals with different delays and the associated register tags that record arrival times in an exemplary integrated circuit design. A PLL 402 may generate a clock signal that is subsequently subject to three delays D1, D2, and D3. The delays D1-D3 may be caused by clock buffers such as the buffers 204, 208, or 210, gating circuitry such as gating circuit 206, any other source of delay (such as path interconnect delay), or any combination of these sources of delay. Various clock points 420, 422, and 424 may be provided from the outputs of delays D1, D2, and D3, respectively. The sum of the delays provided by D1, D2, and D3 may be referred to as the full clock delay spread of the integrated circuit design.

Registers 472, 474, 476, 482, 492, 494, and 496 may all receive the clock generated by PLL 402. However, the amount of delay applied to the particular clock signal received at said registers may vary. As an example, the clock received at registers 472 and 474 may be delayed by D1 and D2 corresponding to an arrival time A1, whereas the clock received at registers 482 and 492 may be delayed by D1, D2, and D3 corresponding to an arrival time A2. Register 496 may receive a clock delayed only by D1, register 476 may receive a clock delayed by D1, D2, and D3, and register 494 may receive a clock delayed by D1 and D2.

As described in connection with FIG. 2, a delay associated with the arrival of a rising clock edge at the clock terminal of a register and the presence of valid data at the output Q of the register may be represented with a delay. In connection with register 472, this delay may be represented as $t_{CQ1}$. Registers 472, 474, and 476 may output to a first combinational logic delay path 462. The combinational logic data path 462 may include separate combinational logic circuits for each of the registers 472, 474, and 476, with respective outputs for each of the registers. Alternatively, the combinational logic data path 462 may combinational logic circuit that performs a common function for subsets of the registers 472, 474, and 476. To avoid unnecessarily obscuring the invention, it may be assumed that the combinational logic data path performs a common function for all of the registers 472, 474, and 476, and exhibits a common delay to the outputs of each of the registers 472, 474, and 476.

TAG-3 associated with the data input node of the register 482 may contain information regarding the arrival time of data from the registers 472 and 474 (i.e., the arrival time A1 plus some delay contributed by the clock-to-output delay $t_{CQ1}$ and the delay exhibited by the combinational logic data path 462) and from the register 476 (i.e., the arrival time A2 plus some delay contributed by the clock-to-output delay of register 476 and the delay exhibited by the combinational logic data path 462).

The output of the combinational logic delay path 462 may be received at the data input D of the register 482. Register 482 may output data sampled from the data input D at its output Q, which is received by another combinational logic data path 464. The output of the combinational logic data path 464 may be provided to registers 492, 494, and 496. TAG-4 may include timing information such as arrival times for the data input D of the register 492, TAG-5 may include timing information such as arrival times for the data input D of the register 494, and TAG-6 may include timing information such as arrival times for the data input D of the register 496.

As shown in FIG. 4, multiple tags such as TAG-1 through TAG-6 may be assigned to the registers 472, 474, 476, 482, 492, 494, and 496. Some of the registers may share a common tag. As an example, registers 472 and 474 may share a first tag TAG-1 and the remaining registers 476, 482, 492, 494, and 496 may be provided individual tags. Tags may be consolidated when the arrival time associated with tag is determined, during a breadth first search, to be less than another tag by a threshold amount corresponding to a full clock delay spread of the largest possible common delay path that could contribute to the delay of the arrival time. In the example of FIG. 4, the full clock delay spread of the circuitry may be the sum of delays D1, D2, and D3.

Figure 5:
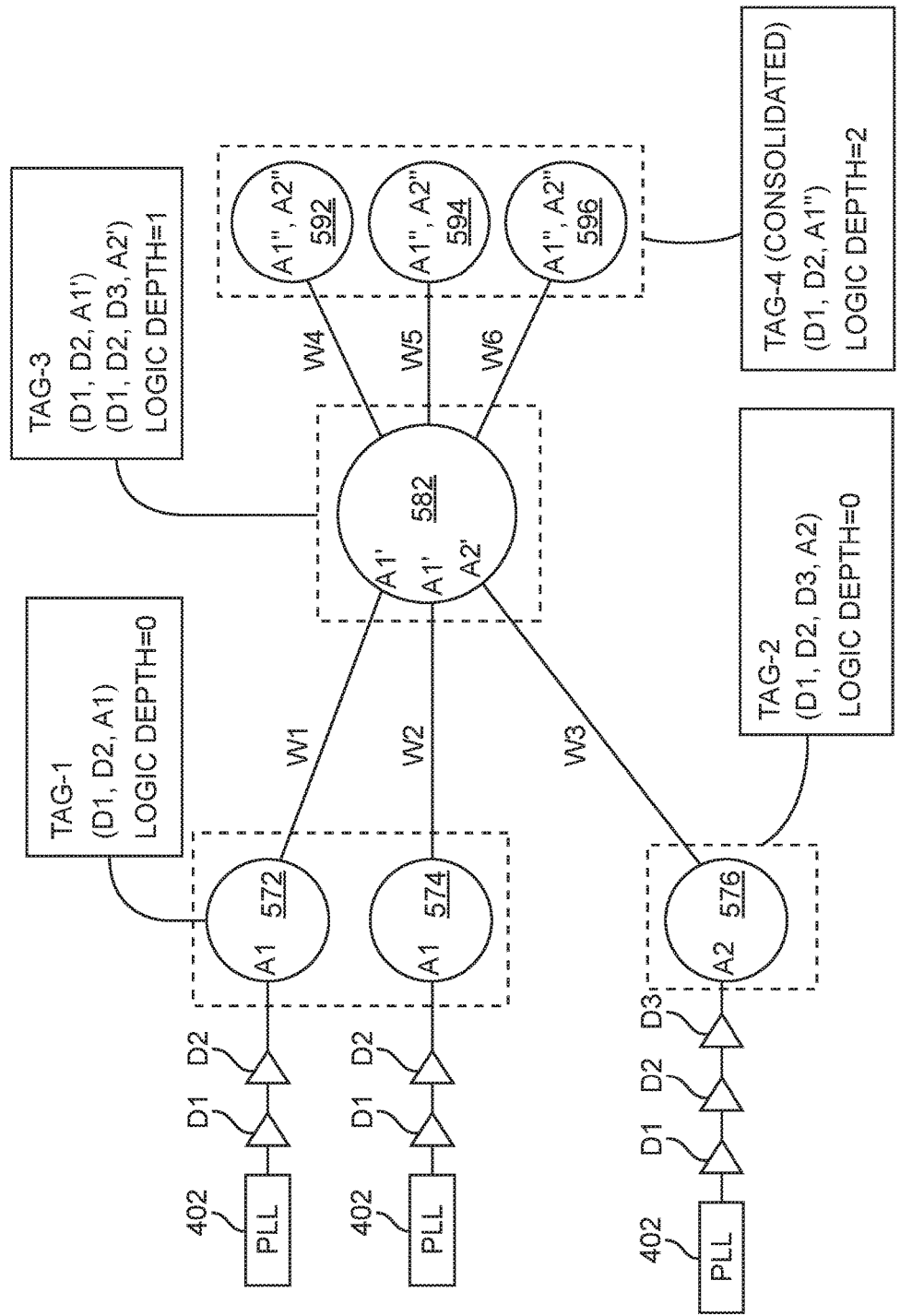
FIG. 5 is a graph representation of the circuitry of FIG. 4 with a detailed view of the tags associated with the circuit nodes in accordance with an embodiment.

FIG. 5 is a graph representation of the circuitry of FIG. 4. The graph node 572 may correspond to the register 472, the node 574 to register 474, the node 576 to register 476, the node 582 to register 482, the node 592 to register 492, the node 594 to register 494, and the node 596 to the register 496. The nodes 572 and 574 may be assigned a single tag TAG-1, because the clock arrival time associated with the nodes 572 and 574 may be identical. Specifically, the arrival time (noted A1 in FIG. 5) of the clock signal produced by PLL 402 at the node 572 may be equal to the arrival time of the clock signal produced by PLL 402 at the node 574, at least because both of the clock signals are delayed by the amount D1 and D2.

A tag such as TAG-1, may be a sorted or ordered linked list of arrival times with partial path completion information. The run time of static timing analysis is directly proportional to the number of tags on a node. For clarity of illustration, some tags in FIG. 5 such as TAG-3 are shown to include multiple arrival times in lieu of two different tags. Multiple tags may be represented as a single tag with multiple tag entries. TAG-1 may include information about the partial path completion information, represented by the portion (D1, D2) of the tag. The partial path completion information may indicate the portion of the common delay D1, D2, and D3, that is applied to the clock path to the nodes 572 and 574. TAG-1 may also include information about the arrival time of the clock signal at the nodes, represented by the portion (A1) of the tag. Also included in TAG-1 may be the logic depth of the tag indicating the number of nodes traversed on a path to arrive at the node. The logic depth for nodes 572 and 574, for example, may be 0, as the nodes 572 and 574 serve as the originating or starting nodes for a path in the breadth-first search.

As the arrival time of the clock signal at node 576 is different from the arrival time at nodes 572 and 574, node 576 may be provided a second tag TAG-2. TAG-2 provided to node 576 may contain partial path completion information, represented by the portion (D1, D2, D3) of the tag. The partial path completion information may indicate the portion of the common delay D1, D2, and D3, that is applied to the clock path to the nodes 572 and 574. TAG-2 may also include information about the arrival time of the clock signal at the nodes, represented by the portion (A2) of the tag. Also included in TAG-2 may be the logic depth of the tag indicating the number of nodes traversed on a path to arrive at the node. The logic depth for node 576, for example, may be 0, as node 576 would serve as the originating/starting nodes for a path in the breadth-first search.

In the graph representation of the circuitry of FIG. 4 illustrated in FIG. 5, the delay associated with the combinational logic data path 462 may be represented by different weights on the respective graph edges connecting the nodes 572, 574, and 576 to the node 582. As an example, the weight W1 may represent the delay contributed by combinational logic delay path 462 to the data output by node 572, W2 may represent the delay contributed by combinational logic delay path 462 to the data output by node 574, and W3 may represent the delay contributed by combinational logic delay path 462 to the data output by node 574. To simplify the illustration of the present invention, it will be assumed that the weights W1, W2, and W3 are equal (i.e., the delay contributed by combinational logic delay path 462 to the data output by nodes 572, 574, and 576 may be assumed to be equal).

The arrival times of the data output by node 572 at the node 582 may be represented as A1'. A1' may represent the arrival time of the data output by node 574 as well, at least because it is assumed that W1 and W2 are equal. The arrival time of the data output by node 576 may be represented as A2'. Node 582 may be provided TAG-3, a tag which may alternatively be considered two tags because it may include two arrival times and partial path completion data points. TAG-3 may include (D1, D2, A1'), representing the partial path completion information for the nodes 572 and 574 (i.e., the delay elements that contribute to the delay at the clock point 422 of FIG. 4) and the arrival time of the data from said nodes. TAG-3 may also include (D1, D2, D3, A2'), representing the partial path completion information for the node 576 (i.e., the delay elements that contribute to the delay at the clock point 424 of FIG. 4) and the arrival time of the data from node 576. TAG-3 may also include respective logic depth of the tag portions. The logic depth for the tag portion (D1, D2, A1') may be 1, and the logic depth for the tag portion (D1, D2, D3, A2') may be 1 as well, at least because the node 582 is the second node in a path associated with the arrival times A1' and A2' respectively.

As described above, weights on the graph edges may represent delays provided circuitry such as combinational logic circuits interposed between the nodes of FIG. 5. Weights W4, W5, and W6 may represent the delay applied to the data that is produced by node 582 by the combinational logic data path 464 before being received at the nodes 592, 594, and 596, respectively. It may be assumed, to simplify the illustration of the present invention, that the weights W4, W5, and W6 are equal. At the nodes 592, 594, and 596, a tag TAG-4 with a single ordered list having partial path information and an arrival time may be provided.

In static timing analysis, a breadth-first search method may be used to traverse the nodes of a graph representation of the circuit nodes. In embodiments of the present invention, after traversing a predetermined or user-specified threshold depth in the graph, tag consolidation may occur. In the example of FIG. 5, tag consolidation may occur after a logic depth of 1. In other words, for nodes having a logic depth of 2 or more (such as the nodes 592, 594, and 596, tag consolidation may occur.

Figure 6:
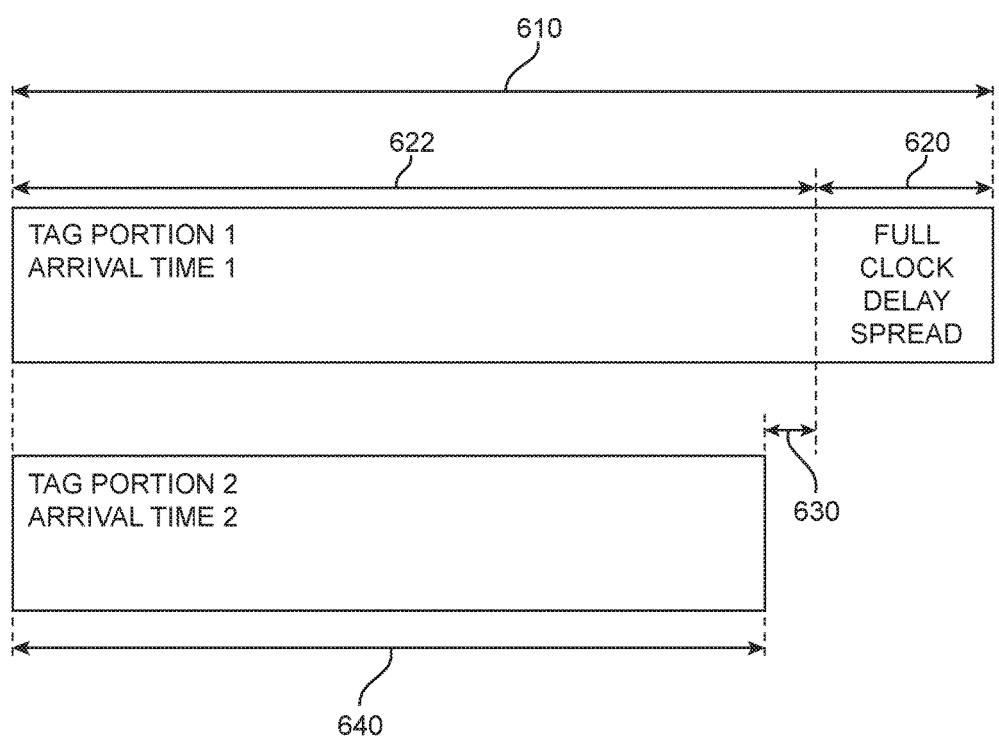
FIG. 6 is a diagram showing two arrival times that vary by an amount greater than a full cock delay spread in accordance with an embodiment.

FIG. 6 illustrates exemplary arrival times that may be subject to consolidation in a critical slack based merging method. A first arrival time associated with a first tag portion (as described above, multiple tag portions with different associated arrival times may be included in a single tag) may have a duration 610. A second arrival time associated with a second tag portion may have a duration 640. A tag with multiple tag portions may be ordered, such that a tag portion associated with the longest/greatest arrival time is the first tag portion in the tag. The first tag portion associated with the first arrival time 610 may therefore be the longest/greatest arrival time. The second tag portion may be a tag portion with the next longest/greatest arrival time in the tag, or any other tag portion in the tag (e.g., the tag portion with the shortest/smallest arrival time).

In a critical slack based tag consolidation method, it may be advantageous to determine the tag portion associated with the arrival time that is maximal, as the maximal arrival time determines the critical timing slack needed for proper circuit operation in the worst-case operating conditions (i.e., the operating conditions in which the path associated with the maximal arrival time is actually encountered or used).

As shown in FIG. 6, not only is the duration 610 of the first arrival time greater than the duration 640 of the second arrival time, the duration 610 is greater than the duration 640 by an amount that exceeds the full clock delay spread 620 (namely, the amount 630). As mentioned above, the full clock delay spread may correspond to the delay exhibited by largest possible common delay path that could contribute to the delay of the arrival time. In the example of FIGS. 4 and 5, the full clock delay spread may be the sum of D1, D2, and D3. Generally, the full clock delay spread corresponds to the delay exhibited by the largest subset of components through which the clock signal passes before being provided to a register.

Because the first arrival time having a duration 610 exceeds the second arrival time having a duration 640 by an amount greater than the full clock delay spread 620, the second arrival time cannot be considered to correspond to a critical path in the timing analysis, and the tag portion corresponding to the second arrival time can therefore be discarded.

Figure 7:
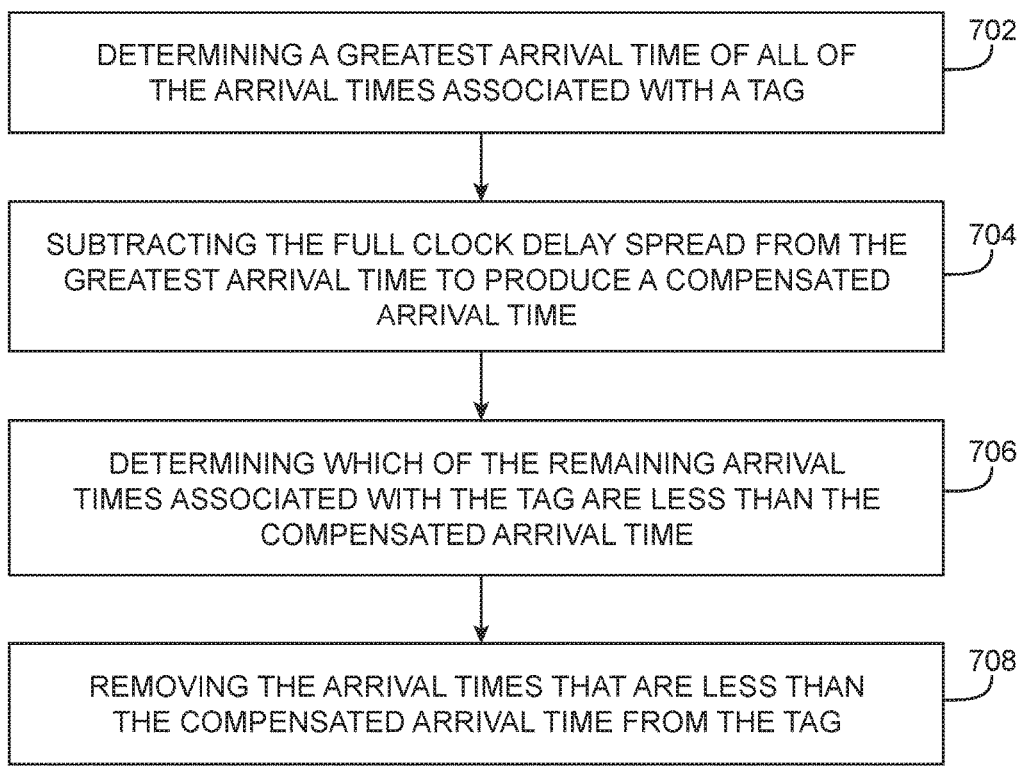
FIG. 7 is a flowchart of steps associated with a critical slack based merging technique in accordance with an embodiment.

FIG. 7 illustrates a method for consolidating arrival times and their associated tag portions in a tag in accordance with an embodiment. At step 702, the greatest arrival time of all the arrival times associated with a tag may be determined. As mentioned above, a tag may be ordered such that the first tag portion of a tag is associated with the greatest arrival time of all of the tag portions.

At step 704, the full clock delay spread may be subtracted from the greatest arrival time determined in step 702 to produce a compensated arrival time. In the example of FIG. 6, this may correspond to the duration 622 (i.e., the full clock spread duration 620 subtracted from the first duration 610). The compensated arrival time 622 may be compared with the remaining arrival times in step 706. Specifically, the arrival times that are less than the compensated arrival time determined in step 704 may be identified and marked. These arrival times that are less than the compensated arrival time are not associated critical path and therefore serve no purpose when determining the critical path timing slack.

At step 708, the arrival times that are less than the compensated arrival times (i.e., the arrival times identified in step 706) may be removed from the tag.

Turning to FIG. 5 again, the nodes 592, 594, and 596 may receive a first arrival time A1" corresponding to the arrival time associated with A1' after the weight/delay associated with W1, W2, or W3 was applied and a second arrival time A2" corresponding to the arrival time associated with A2' after the weight/delay associated with W1, W2, or W3 was applied. TAG-4 may have been consolidated to only include the A1" value after determined (using the method of FIG. 7, for example) that the arrival time A1" was greater than the arrival time associated with A2" even after being compensated by removing the full clock delay spread from the arrival time A1". TAG-4 may be associated with a logic depth of 2, as the nodes 592, 594, and 596 are reached by traversing two prior nodes on the path. In the example of FIG. 5, tag consolidation may occur only for tags having a logic depth of 2 or greater, meaning no tag consolidation would be performed at node 582, which has a logic depth of 1.

Figure 8:
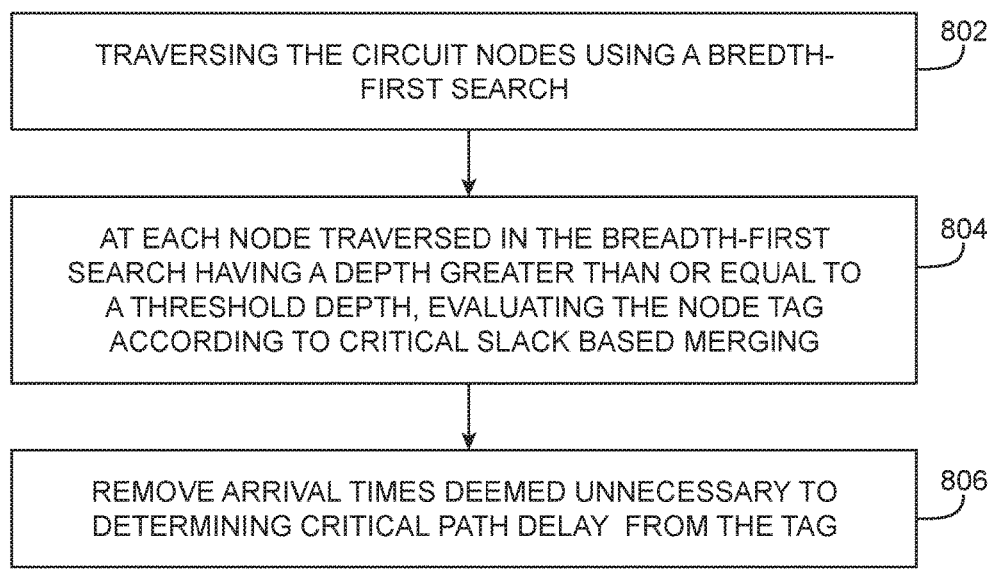
FIG. 8 is a flowchart of steps associated with performing static timing analysis with dynamic tag consolidation in accordance with an embodiment.

FIG. 8 illustrates a flowchart of steps for performing static timing analysis with dynamic tag allocation. At step 802, using the terminology associated with a graph representation of the circuit nodes, a breadth-first search may be used to traverse the circuit nodes.

At step 804, nodes encountered or traversed in the breadth first search having a depth greater than or equal to a threshold depth may have their respective tag evaluated. Specifically, arrival times in the tag portions of the tag for nodes with a depth greater than or equal to the threshold depth may be evaluated according to the critical slack based merging method described in steps 702-706 of FIG. 7. For tags on nodes with a logic depth of 0 (e.g., nodes 572, 574, and 576), this evaluation step may be skipped, as there are no comparisons between different arrival times to be made. However, if an evaluation of all tags associated with every circuit node in an integrated circuit design is desired, the threshold depth may be set to 0. The threshold depth may be some predetermined or user-determined threshold value. In the example of FIG. 5, for example, only the tag(s) with a logic depth of 2 or greater (i.e. the tag(s) associated with the nodes 592, 594, and 596) may be subject to the evaluation step of step 804.

At step 806, the arrival times deemed unnecessary to determining critical path delay according to the critical slack based merging may be removed from the tag(s), in a manner similar to the removal of tag portions in step 708 of FIG. 7. The consolidation of timing information described in connection with step 708 of FIG. 7 may result in tags with smaller sizes, thereby improving the runtime of timing analysis tools. By removing non-critical arrival time information as described in FIG. 7, the accuracy of critical path timing information for all of the end-nodes in a circuit is preserved.

Figure 9:
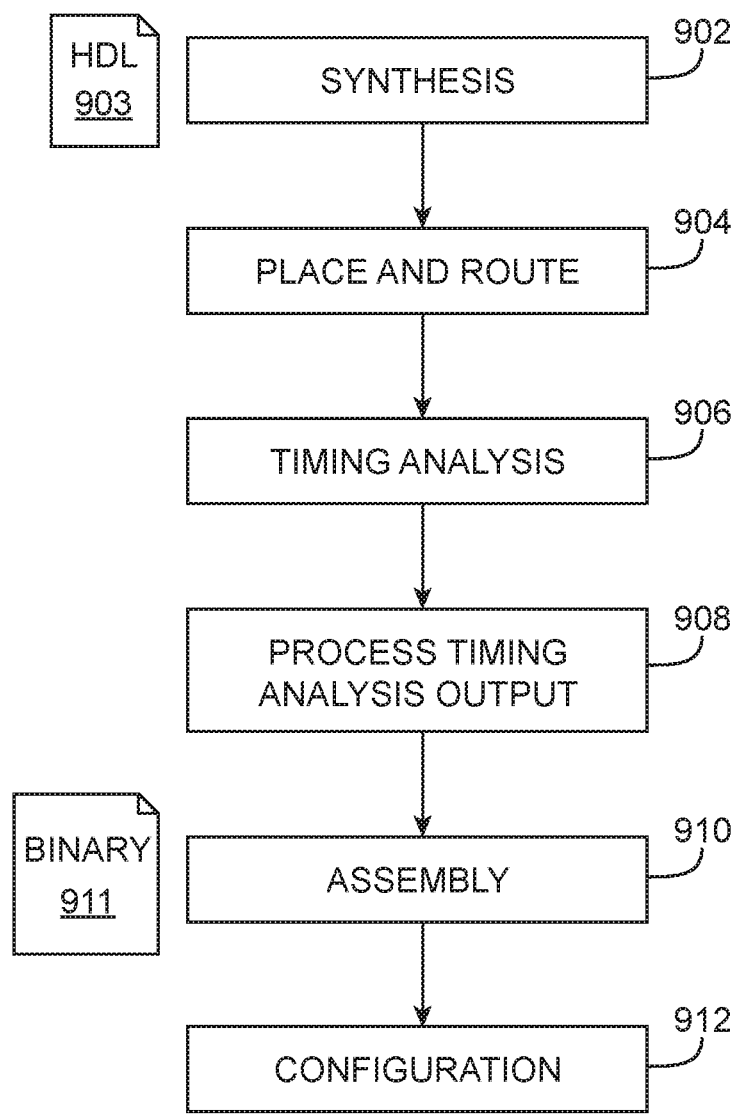
FIG. 9 is a flowchart of steps associated with creating and compiling a circuit design for an integrated circuit using a computer-aided-design tools in accordance with an embodiment.

FIG. 9 depicts illustrative method to create and compile a circuit design for an IC using an electronic design automation (EDA) tool in accordance with one embodiment of the present invention. The method of FIG. 9 may begin when a circuit designer or engineer create a circuit design that is embodied in a hardware description language (HDL) file 903. HDL file 903 may be synthesized by the EDA tool during synthesis step 902. For instance, synthesis operation performed at step 902 may translate the circuit design embodied in HDL file 903 into a discrete netlist of logic-gate primitives. The synthesized logic gates in the circuit design are then placed and routed on a target IC device during a place and route operation at step 904. Generally, wire nets may be added to connect the logic gates and other components on the target IC device to route signals in the circuit design during the place and route operation at step 904.

After the place and route operation, a timing analysis operation may be performed at step 906. In one embodiment, the timing analysis operation may be a static timing analysis operation that is performed on the integrated circuit design to obtain the expected timing of the circuit design. It should be appreciated that the timing analysis operation may compute the delays of different paths in the circuit design and the timing constraints of the overall circuit design. For instance, the timing analysis operation performed at step 906 may calculate the maximum and minimum delays of respective timing paths in the circuit design. The maximum and minimum delays may be calculated based on different factors including transistor aging and other factors such as on-chip variation (e.g., process, temperature and voltage variations).

At step 906, the method of FIG. 8 to traverse the circuit nodes and evaluate arrival time tags according to critical slack based merging methods may be used. Tags associated with a logic depth greater than a predetermined or user determined threshold may be evaluated and consolidated when a maximal arrival time associated with the tag is greater than other arrival times associated with the tag that are less than the maximal arrival time by an amount greater than or equal to the full clock delay spread of the circuit design. The full clock delay spread of the circuit design may correspond to the largest subset of components that is common to a delay path from which a clock signal is provided to the registers in the circuit design. At an endpoint node of the circuit design, consolidated tag information for the endpoint node may be used to determine the critical path delay of the circuit design.

Binary configuration file 911 may then be produced during an assembly operation at step 910. Binary configuration file 911 contains description of the circuit design and may be used to program a programmable logic device such as the PLD 10 of FIG. 1 (e.g., contents of binary configuration file is loaded onto PLD 10) during a configuration operation at step 912. In one embodiment, prior to fabricating the IC or loading the configuration on the actual device (e.g., programming PLD 10 with binary configuration file 911), the output of the timing analysis operation performed at step 906 may be analyzed and processed at step 908 to ensure that timing requirements are met in order for the circuit design to operate correctly. As an example, signals that arrive too early or too late after a clock's active transition may cause undesired errors during operation of the circuit.

The foregoing is merely illustrative of the principles of this invention and various modifications can be made by those skilled in the art without departing from the scope and spirit of the invention.

What is claimed is:

1. A method of performing timing analysis on an integrated circuit design using an electronic design tool, the method comprising:
   identifying circuit nodes in the integrated circuit design;
   traversing the circuit nodes starting from a set of starting nodes of the circuit nodes;
   at each circuit node in a set of selected circuit nodes that are different from the set of starting nodes, creating a tag with timing information corresponding to a set of input nodes feeding into the selected circuit nodes;
   consolidating timing information in the tags for the selected circuit nodes to eliminate non-critical timing information by removing non-critical timing information for circuit nodes having a depth greater than a value selected from the group consisting of: a user-specified threshold depth and a pre-determined threshold depth;
   producing a configuration file based on the consolidated timing information; and
   loading the configuration file onto an integrated circuit and programming the integrated circuit using the configuration file.

2. The method defined in claim 1, wherein traversing the circuit nodes comprises:
   traversing the circuit nodes using a breadth-first search.

3. The method defined in claim 1, wherein creating the tag with timing information for each circuit node in the set of selected circuit nodes comprises:
   creating a list of arrival times for a first node in the set of selected circuit nodes based on data arrival times from input circuit nodes that that are coupled to the first node in the integrated circuit design.

4. The method defined in claim 3, wherein creating the list of arrival times for the first node comprises:

including partial path completion information each of the arrival times in the list of arrival times, wherein the partial path completion information indicates which portions of a common delay path from a clock source are respectively applied to each of the arrival times.

5. The method defined in claim 1, wherein consolidating the timing information comprises:
   identifying the timing information corresponding to a maximal arrival time in the tag for a first node of the selected circuit nodes; and
   comparing the maximal arrival time to remaining arrival times in the timing information in the tag for the first node of the selected circuit nodes.

6. The method defined in claim 5, wherein comparing the maximal arrival time to the remaining arrival times comprises:
   determining which of the remaining arrival times is shorter than the maximal arrival time by an amount greater or equal to a full clock delay spread of the circuit nodes, wherein the full clock delay spread of the circuit nodes corresponds to a maximum possible delay spread contributed by delay elements in a clock path to the circuit nodes.

7. The method defined in claim 6, wherein consolidating the timing information further comprises:
   removing the arrival times determined to be shorter than the maximal arrival time by the amount greater or equal to a full clock delay spread of the circuit nodes from the timing information in the tag for the first node.

8. The method defined in claim 1, further comprising:
   determining a critical path delay of the integrated circuit design based on consolidated timing information at an endpoint node of the circuit nodes.

9. A method of performing timing analysis on an integrated circuit design using an electronic design tool, the method comprising:
   for a first circuit node in the integrated circuit design, creating a first tag with timing information with at least first and second arrival times;
   removing non-critical arrival times from the first tag for the first circuit node;
   for a second circuit node that is coupled to the first circuit node, creating a second tag with timing information with at least third and fourth arrival times, wherein at least one of the at least third and fourth arrival times is based on timing information from the first tag;
   removing non-critical arrival times from the second tag;
   creating a configuration file for an integrated circuit based on the second tag; and
   programming an integrated circuit using the configuration file.

10. The method defined in claim 9, wherein removing non-critical arrival times from the first tag comprises:
    determining a greatest arrival time from the at least first and second arrival times;
    subtracting a delay amount from the greatest arrival time to produce a compensated arrival time;
    comparing the compensated arrival time to the at least first and second arrival times; and
    removing arrival times of the at least first and second arrival times that are less than the compensated arrival time.

11. The method defined in claim 10, wherein subtracting the delay amount comprises:
    subtracting a full clock delay spread from the greatest arrival time to produce the compensated arrival time, wherein the full clock delay spread corresponds to a maximum possible delay spread contributed by delay elements in a clock path provided to a starting circuit node coupled to the first circuit node.

12. The method defined in claim 9, wherein the at least one of the at least third and fourth arrival times is based on a maximal arrival time from the first tag, and wherein creating the second tag comprises:
    adding a delay associated with a combinational logic data path interposed between the first node and the second node to the maximal arrival time from the first tag to produce an adjusted arrival time; and
    adding the adjusted arrival time to the second tag.

13. A non-transitory computer-readable medium for performing static timing analysis for an integrated circuit design, comprising instructions for:
    creating tags for circuit nodes in the integrated design, wherein each of the tags includes at least two arrival times and partial path completion information associated with each of the at least two arrival times, wherein the partial path completion information indicates which portions of a common delay path from a clock source are respectively applied to each of the at least two arrival times;
    for tags associated with circuit nodes having a logic depth in the integrated circuit design greater than a depth threshold, consolidating the at least two arrival times in the tags to eliminate non-critical arrival times;
    creating a configuration file based on the consolidated arrival times; and
    configuring an integrated circuit using the configuration file.

14. The non-transitory computer-readable medium defined in claim 13, wherein the instructions for consolidating the arrival times in the tags comprise instructions for:
    determining a greatest arrival time from the at least two arrival times associated with a first tag for a first circuit node of the circuit nodes, wherein the first circuit node has a logic depth greater than the depth threshold; and
    comparing the greatest arrival time to remaining arrival times from the at least one arrival time to determine whether or not the remaining arrival times can be removed from the first tag.

15. The non-transitory computer-readable medium defined in claim 14, wherein the instructions for comparing the greatest arrival time to the remaining arrival times comprise instructions for:
    subtracting a full clock delay spread from the greatest arrival time to provide a compensated arrival time, wherein the full clock delay spread corresponds to a maximum possible delay spread contributed by delay elements in a clock path provided to a starting circuit node coupled to the first circuit node.

16. The non-transitory computer-readable medium defined in claim 15, wherein the instructions further comprise instructions for:
    comparing the compensated arrival time to each of the remaining arrival times; and
    removing particular arrival times of the remaining arrival times that are determined to be less than the compensated arrival time.

17. The non-transitory computer-readable medium defined in claim 13, comprising further instructions for:
    traversing the circuit nodes using a breadth first search; and consolidating the at least two arrival times in the tags in the order traversed by the breadth first search.

* * * * *